(12) United States Patent
Kim

(10) Patent No.: US 12,507,399 B2
(45) Date of Patent: Dec. 23, 2025

(54) SEMICONDUCTOR DEVICE AND METHOD FOR FABRICATING THE SAME

(71) Applicant: SK hynix Inc., Gyeonggi-do (KR)

(72) Inventor: Jun Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 823 days.

(21) Appl. No.: 17/724,476

(22) Filed: Apr. 19, 2022

(65) Prior Publication Data

US 2023/0138505 A1    May 4, 2023

(30) Foreign Application Priority Data

Oct. 28, 2021    (KR) .................. 10-2021-0145646

(51) Int. Cl.
| | |
|---|---|
| H10B 12/00 | (2023.01) |
| G11C 5/06 | (2006.01) |
| H01L 21/762 | (2006.01) |
| H10D 64/27 | (2025.01) |

(52) U.S. Cl.
CPC ....... *H10B 12/36* (2023.02); *H01L 21/76224* (2013.01); *H01L 21/76229* (2013.01); *H10B 12/053* (2023.02); *H10B 12/056* (2023.02); *H10B 12/34* (2023.02); *H10B 12/488* (2023.02); *H10D 64/513* (2025.01); *G11C 5/063* (2013.01); *H10B 12/315* (2023.02)

(58) Field of Classification Search
CPC .... H10B 12/056; H10B 12/36; H10B 12/053; H10B 12/34; H10B 12/488; H10D 64/513; H01L 21/76224; H01L 21/76229
See application file for complete search history.

(56) References Cited

U.S. PATENT DOCUMENTS

| | | | |
|---|---|---|---|
| 9,082,850 B2 | 7/2015 | Kim et al. | |
| 9,349,737 B2 | 5/2016 | Pulugurtha et al. | |
| 2018/0323190 A1* | 11/2018 | Feng | H10B 12/34 |
| 2021/0126098 A1* | 4/2021 | Lee | H10B 12/34 |
| 2022/0384431 A1* | 12/2022 | Jhan | H10D 84/834 |
| 2023/0088377 A1* | 3/2023 | Liu | H10B 12/34 |
| | | | 257/506 |

* cited by examiner

*Primary Examiner* — Peter M Albrecht
(74) *Attorney, Agent, or Firm* — IP & T GROUP LLP

(57) ABSTRACT

Present invention provides a method of fabricating a semiconductor device capable of improving word line interference between adjacent cells. A semiconductor device comprises: a device isolation layer defining active regions on a substrate and including a first region and a second region, the active regions being spaced apart in a first direction by the first region having a first interval and by the second region having a second interval being larger than the first interval; a gate trench extending in the first direction to cross the active regions and the first and second regions; and a buried word line gap-filling the gate trench, wherein the first region disposed below the gate trench is formed by the first insulating layer, and wherein the second region disposed below the gate trench is formed by a stack structure of the first insulating layer and a second insulating layer.

24 Claims, 22 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0145646, filed on Oct. 28, 2021, which is incorporated herein by reference in its entirety.

BACKGROUND

1. Field

The present invention relates to a semiconductor device and a fabricating method thereof, and more particularly, to a semiconductor device including a buried gate and a fabricating method thereof.

2. Description of the Related Art

In order to improve the degree of integration of the semiconductor device, a semiconductor device having a structure in which a word line is buried in a substrate is being researched.

SUMMARY

An embodiment of the present invention provides a method of fabricating a semiconductor device capable of improving word line interference between adjacent cells.

A semiconductor device according to an embodiment of the present invention comprises: a device isolation layer defining a plurality of active regions on a substrate and including a first region and a second region, the active regions being spaced apart in a first direction by the first region having a first interval and by the second region having a second interval, the second interval being larger than the first interval; a gate trench extending in the first direction to cross the active regions and the first and second regions of the device isolation layer; and a buried word line gap-filling the gate trench, wherein the first region of the device isolation layer disposed below the gate trench is formed by a first insulating layer, and wherein the second region of the device isolation layer disposed below the gate trench is formed by a stack structure of the first insulating layer and a second insulating layers.

A method of fabricating a semiconductor device according to an embodiment of the present invention comprises: forming a device isolation layer defining a plurality of active regions on a substrate and including a first region and a second region, the active regions being spaced apart in a first direction by the first region having a first interval and by the second region having a second interval, the second interval being larger than the first interval; forming a gate trench extending in the first direction to cross the active regions and the first and second regions of the device isolation layer; and forming a buried word line gap-filling the gate trench, wherein the first region of the device isolation layer disposed below the gate trench is formed by a first insulating layer, and wherein the second region of the device isolation layer disposed below the gate trench is formed by a stack structure of the first insulating layer and a second insulating layer.

A semiconductor device according to an embodiment of the present invention comprises: a plurality of active regions arranged along a first direction in a substrate and separated by alternating first and second regions of a device isolation layer; and a buried word line extending in the first direction and crossing the plurality of the active regions and the first and second regions of the device isolation layer, wherein the first region of the device isolation layer is formed by a first insulating layer and the second region of the device isolation layer is formed by a stack of the first insulating layer and a second insulating layer.

The present invention has the effect of improving the reliability of the semiconductor device by improving the word line interference between adjacent cells.

DETAILED DESCRIPTION

Figure 1:
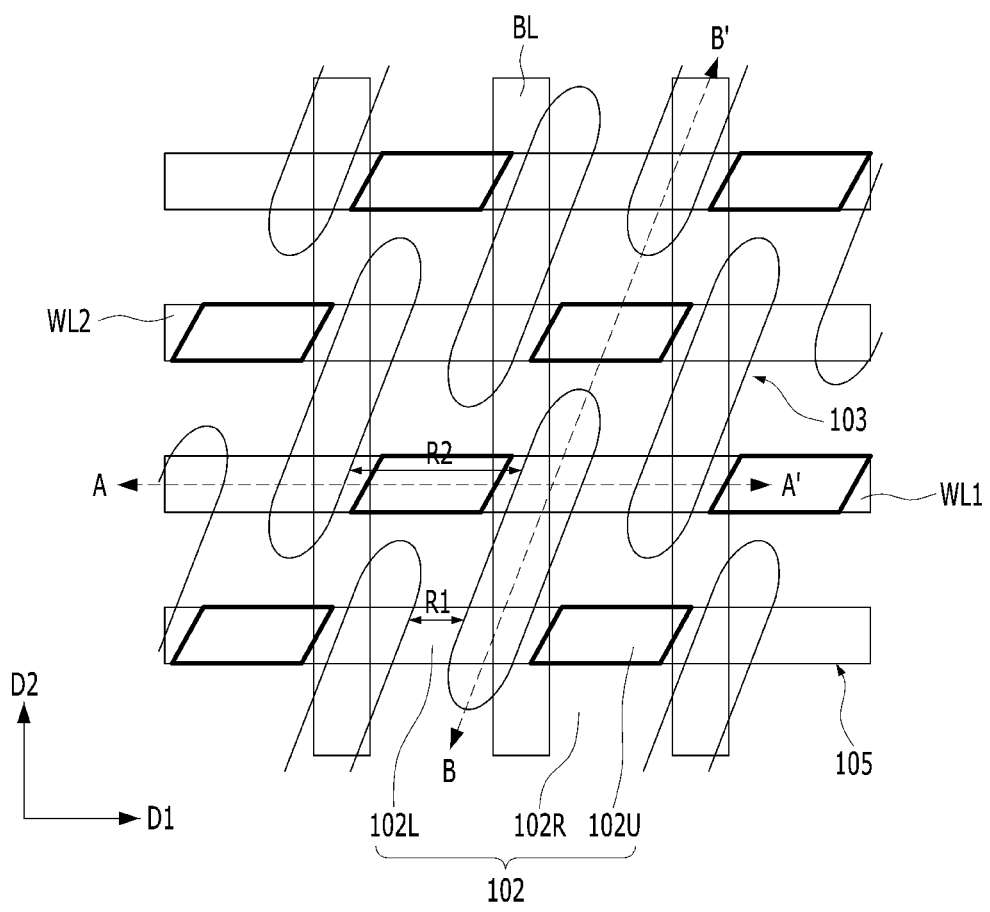
FIG. 1 is a plan view of a semiconductor device according to an embodiment of the present invention.

Various embodiments described herein will be described with reference to cross-sectional views, plan views and block diagrams, which are schematic views of the present invention. Therefore, the structures of the drawings may be modified by fabricating tolerances. Various embodiments of the present invention are not limited to the specific structures shown in the drawings, but may include any changes in the structures that may be produced according to a fabricating process. Also, any regions and shapes of regions illustrated in the drawings with schematic views are intended to illustrate specific examples of structures of regions of the various elements, and are not intended to limit the scope of the invention.

Figure 2A:
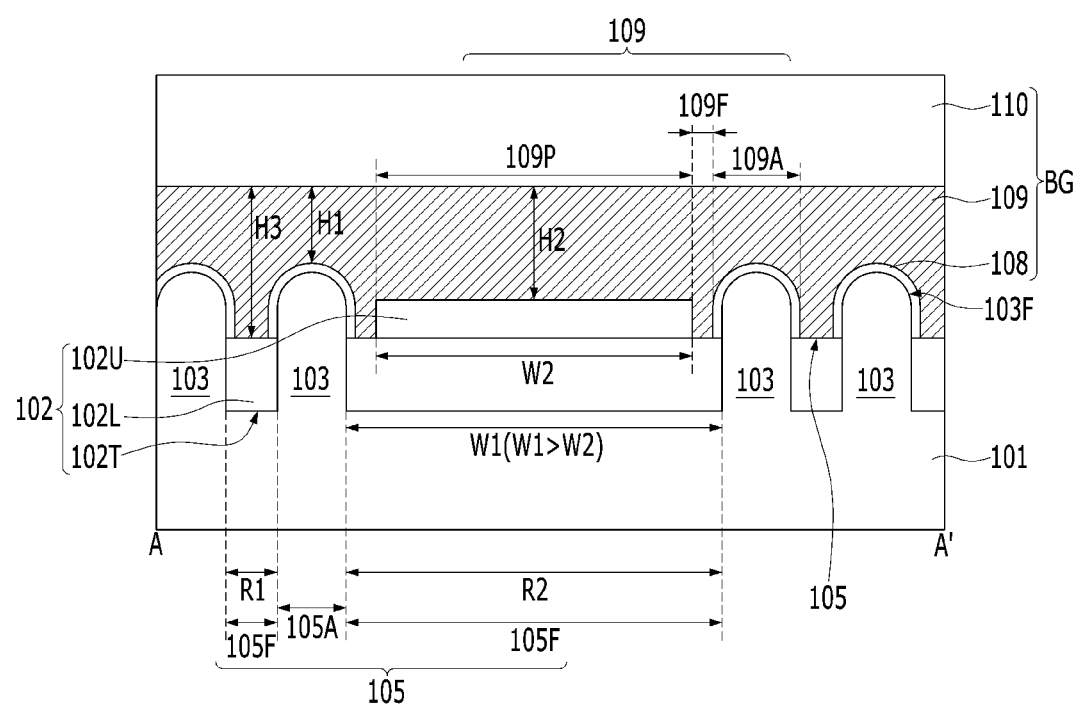
FIGS. 2A and 2B are cross-sectional views illustrating a semiconductor device according to an embodiment of the present invention.
Figure 2B:
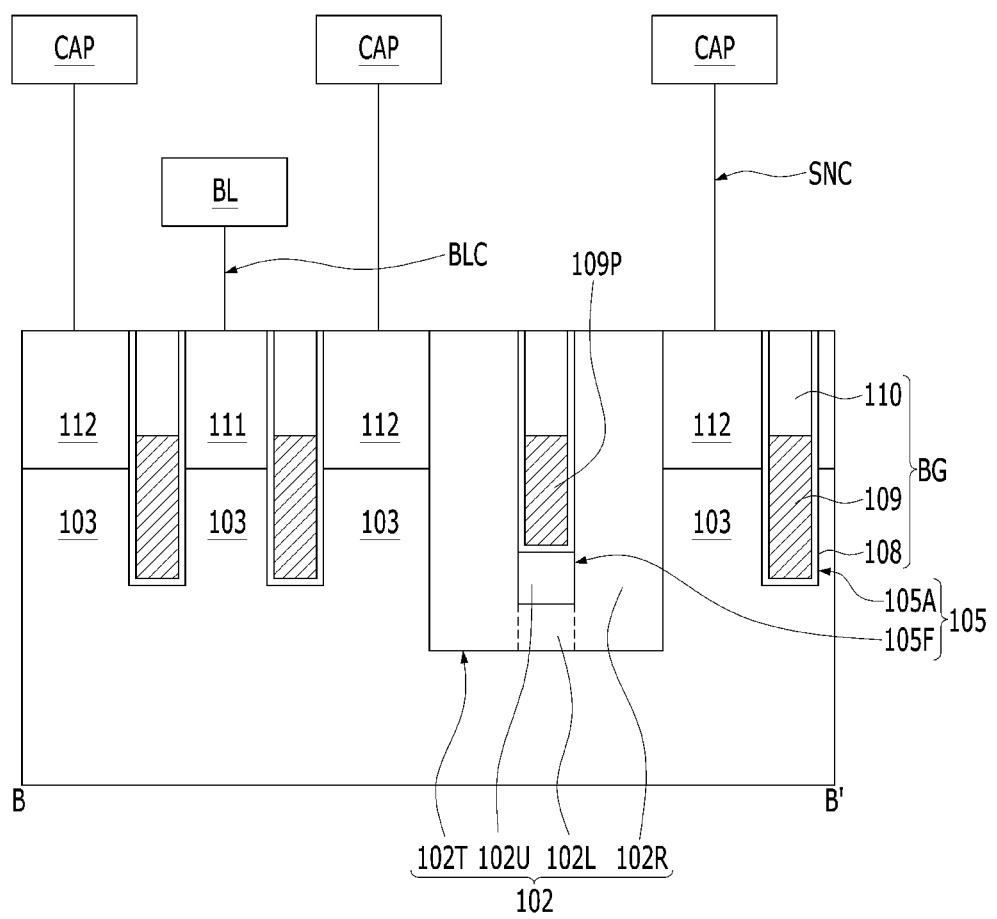
Figure 3:
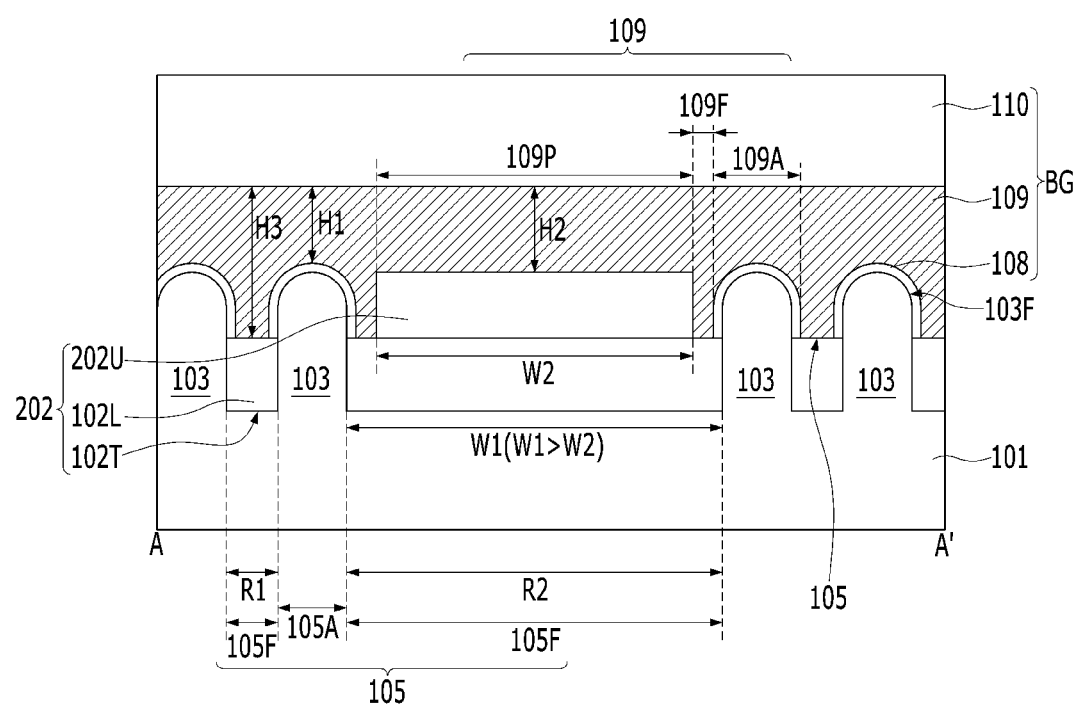
FIGS. 3 and 4 are cross-sectional views illustrating semiconductor devices according to embodiments of the present invention.
Figure 4:
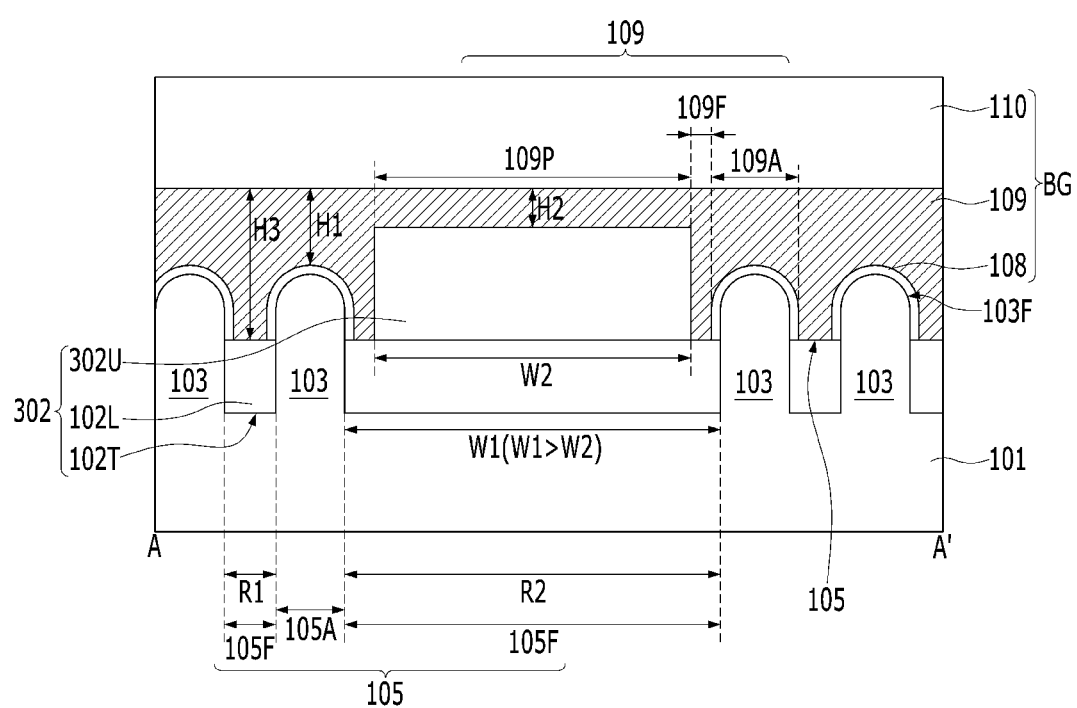

FIG. 1 is a plan view of a semiconductor device according to an embodiment of the present invention. FIGS. 2A and 2B are cross-sectional views illustrating a semiconductor device according to an embodiment of the present invention. FIG. 2A is a cross-sectional view taken along line A-A' of FIG. 1, and FIG. 2B is a cross-sectional view taken along line B-B' of FIG. 1. FIGS. 3 and 4 are cross-sectional views illustrating semiconductor devices according to embodiments of the present invention. FIGS. 3 and 4 are cross-sectional views taken along line A-A' of FIG. 1.

Referring to FIGS. 1, 2A, and 2B, the semiconductor device according to an embodiment of the present invention may include a substrate 101 including an active region 103, an isolation layer 102, and gate structures BG formed in the substrate 101. In addition, the semiconductor device may include bit lines BL and capacitors CAP formed on the substrate 101.

The substrate 101 may be any material suitable for semiconductor processing. The substrate 101 may include a semiconductor substrate. The substrate 101 may be made of a material containing silicon. The substrate 101 may include silicon, monocrystalline silicon, polysilicon, amorphous silicon, silicon germanium, monocrystalline silicon germanium, polycrystalline silicon germanium, carbon doped silicon, combinations thereof, or multiple layers thereof. The substrate 101 may include other semiconductor materials such as germanium. The substrate 101 may include a III/V group semiconductor substrate, for example, a compound semiconductor substrate such as gallium arsenide (GaAs). The substrate 101 may include a silicon on insulator (SOI) substrate.

The active region 103 defined by the device isolation layer 102 may be formed to have a major axis and a minor axis, and may be two-dimensionally arranged along the major axis direction and the minor axis direction. For example, the active region 103 may have a bar shape having a length longer than a width, and may be arranged in an island shape.

The device isolation layer 102 may include a device isolation trench 102T defining a plurality of active regions 103 in the substrate 101 and an insulating layer gap-filled in the device isolation trench 102T. In the device isolation layer 102, an insulating structure gap-filling a region of the device isolation trench 102T overlapping the field trench 105F and an insulating structure gap-filling a region of the device isolation trench 102T excluding the field trench 105F may be different. The field trench 105F may refer to the gate trench 105 formed in the device isolation trench 102T.

The isolation insulating layer 102R may be gap-filled in the device isolation trench 102T in a region excluding the field trench 105F. The top surface of the isolation insulating layer 102R may be at the same level as the top surface of the substrate 101. The insulating structure gap-filling a region of the device isolation trench 102T overlapping the field trench 105F may be different from an insulating structure in which the active regions 103 are spaced apart in the first direction D1 by the first region R1 having a first interval and from an insulating structure in which the active regions 103 are spaced apart in the first direction D1 by the second region R2 having a second interval which is greater than the first interval. A first insulating layer 102L may be gap-filled in the first and second regions R1 and R2 to a first height. In the second region R2, the second insulating layer 102U may be locally formed on the first insulating layer 102L. The isolation insulating layer 102R and the first insulating layer 102L may be continuous. The isolation insulating layer 102R and the first insulating layer 102L may include the same material formed through the same process.

For example, the device isolation layer 102 may include the isolation insulating layer 102R gap-filled in the device isolation trench 102T, the first insulating layer 102L gap-filled by a first height in the first and second regions R1 and R2 of the device isolation trench 102T overlapping the field trench 105F, and the second insulating layer 102U locally formed over the first insulating layer 102L in the second region R2.

The top surface of the first insulating layer 102L may be located at a level lower than the top surface of the active region 103. The active region 103 protruding between the first insulating layer 102L may be referred to as a 'fin 103F.' The first insulating layer 102L may be formed to be gap-filled in the device isolation trench 102T so that a sidewall thereof is in contact with the active region 103. The first insulating layer 102L may include, for example, silicon oxide.

The second insulating layer 102U may be locally formed on the first insulating layer 102L gap-filled in the second region R2 of the device isolation trench. The second insulating layer 102U may be formed to have a width smaller than the width of the second region R2. That is, the width W2 of the second insulating layer 102U may be smaller than the width W1 of the first insulating layer 102L formed in the second region R2 (W1>W2). The sidewall of the second insulating layer 102U may be spaced apart from the sidewall of the adjacent active region 103. In the second region R2, the first insulating layer 102L may be exposed between the second insulating layer 102U and the adjacent active region 103. Accordingly, fins 103F of the same height may be formed by the first insulating layer 102L disposed below the active region 103 in both the active regions 103 in contact with the first region R1 and the second region R2, respectively. The second insulating layer 102U may include, for example, silicon oxide. The second insulating layer 102U may include the same material as the first insulating layer, or may include a different material.

The top surface of the second insulating layer 102U may be located at a higher level than the top surface of the first insulating layer 102L. That is, the top surface of the device isolation layer 102 formed in the first region R1 may be located at a lower level than the top surface of the device isolation layer 102 formed in the second region R2. In this embodiment, the top surface of the second insulating layer 102U may be located at a lower level than the top surface of the active region 103.

In another embodiment, as shown in FIG. 3, the top surface of the second insulating layer 202U may be positioned at the same level as the top surface of the active region 103.

In another embodiment, as shown in FIG. 4, the top surface of the second insulating layer 302U may be located at a higher level than the top surface of the active region 103.

The word lines WL1 and WL2 may cross the active regions 103 and extend in a first direction D1. The bit lines BL may extend in a second direction D2 crossing the first direction D1. The first direction D1 and the second direction D2 may cross perpendicularly.

As shown in FIG. 1, the active regions 103 are arranged to be tilted at a predetermined angle with respect to the word lines 109 (WL1 and WL2) and the bit lines BL, so that one active region 103 may cross two word lines WL and one bit line BL. Accordingly, one active region 103 has a structure of two unit cells, and one unit cell has a length of 2F in the first direction D1 and a length of 4F in the second direction where "F" is the minimum feature size. Thus, the area of the unit cell is 6F2.

According to the 6F2 cell structure, in order to minimize the cell area, the word line WL1 and WL2 and the bit line BL cross each other vertically and the active regions 103 are tilted in a diagonal direction with respect to the word line WL1 and WL2 and the bit line BL. The semiconductor device according to the present invention is not limited to the 6F2 cell structure, and may include any cell structure capable of improving the integration degree of the semiconductor device.

The gate structures BG may include gate trenches 105 formed in the substrate 101, gate insulating layers 108 uniformly formed on inner walls of the gate trenches 105, the word lines 109 partially filling the inside of the gate trenches 105, and the gate capping layer 110 filling the remainder of the gate trenches 105 on the word line 109.

The word line 109 is formed of buried gate lines, thereby implementing a buried channel transistor. The buried channel transistor may reduce a unit cell area and increase an effective channel length compared to a planar transistor. In addition, in the buried channel transistor, since the word line 109 is buried in the substrate 101, the capacitance between the word line 109 and the bit line BL and the total capacitance of the bit line BL can be lowered to reduce parasitic capacitance.

The gate trench 105 may include an active trench 105A crossing the active region 103 and a field trench 105F formed in the device isolation layer 102. The gate trench 105 may extend continuously from active trench 105A to field trench 105F.

The word line 109 may include an active gate electrode 109A in the active trench 105A and a field gate electrode 109P in the field trench 105F. Top surfaces of the active gate electrode 109A and the field gate electrode 109P may be located at the same level. The word line 109 may include a fin gate electrode 109F formed in the fin 103F along the first direction D1. The fins 103F may be formed on both sides of the active region 103 in the first direction. That is, the fin 103F may be formed between the active region 103 and the field trench 105F in the second region R2 and also be formed in the first region R1 of the device isolation layer 102.

A depth H3 of the fin gate electrode 109F may be greater than a depth H2 of the field gate electrode 109P. The bottom surface of the fin gate electrode 109F may be located at a level lower than the bottom surface of the field gate electrode 109P. The bottom surface of the fin gate electrode 109F may be located at a lower level than the bottom surface of the active gate electrode 109A in the first region R1 of the device isolation layer 102 where word line interference between neighboring cells does not occur. Accordingly, the channel length may be sufficiently secured by the fin gate electrode 109F to increase the driving current of the transistor and improve the operating characteristics.

Referring to FIG. 2B, a first impurity region 111 and a second impurity region 112 serving as a source and a drain of the transistor may be formed in the active region 103 disposed on both sides of the active gate electrode 109A. The first impurity region 111 may be electrically connected to the bit line BL, and the second impurity region 112 may be electrically connected to the capacitor CAP. The bit line BL and the first impurity region 111 may be electrically connected to each other by a bit line contact plug BLC. The capacitor CAP and the second impurity region 112 may be electrically connected to each other by a storage contact plug SNC.

The active trench 105A and the field trench 105F may have different levels of bottom surfaces. The depth H1 of the active trench 105A may be smaller than the depths H3 and H2 of the field trench 105F in the first and second regions R2. The bottom surface of the field trench 105F may be located at a level lower than the bottom surface of the active trench 105A. The field trench 105F may have bottom surfaces at different levels in the first region R1 and the second region R2.

In an embodiment of the present invention, the depth H2 of the field trench 105F of the second region R2 may be smaller than the depth H3 of the field trench 105F of the first region R1 due to the second insulating layer 102U. See, for example, FIG. 2A. For example, the depth of the field gate electrode 109P, that is the passing gate crossing the device isolation layer 102 formed between the second impurity regions 112 of the active regions 103 adjacent to each other with one word line 109 interposed therebetween, may be as shallow as the thickness of the second insulating layer 102U. Accordingly, the area of the field gate electrode 109P of a word line facing the active gate electrode 109A of an adjacent word line is reduced, thereby preventing word line interference between neighboring cells (Row Hammer). The effect of preventing the word line interference phenomenon may increase as the area of the field gate electrode 109P decreases.

In another embodiment, as shown in FIG. 3, the depth H2 of the field trench 105F in the second region R2 may be similar to the depth H1 of the active trench 105A. The depth H3 of the field trench 105F in the first region R1 may be greater than the depth H2 of the field trench 105F in the second region R2.

In another embodiment, as shown in FIG. 4, the depth H2 of the field trench 105F in the second region R2 may be smaller than the depth H1 of the active trench 105A and the depth H3 of the field trench 105F in the first region R1. The depth H3 of the field trench 105F in the first region R1 may be greater than the depth H1 of the active trench 105A.

FIGS. 5A to 5H are cross-sectional views illustrating a method of fabricating a semiconductor device according to an embodiment of the present invention. FIGS. 5A to 5H are cross-sectional views taken along line A-A' of FIG. 1.

Figure 5A:
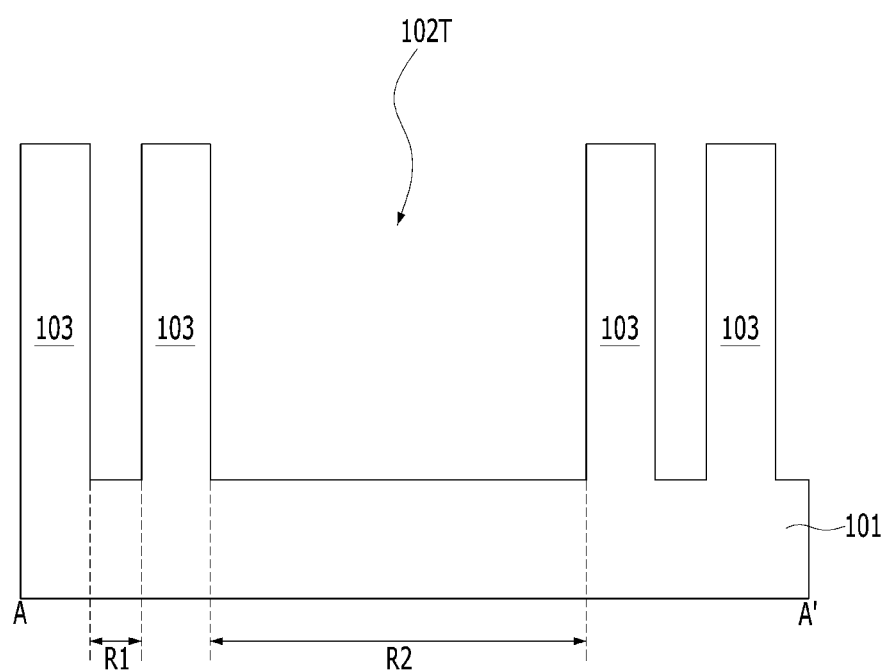
FIGS. 5A to 5H are cross-sectional views illustrating a method of fabricating a semiconductor device according to an embodiment of the present invention.

As shown in FIGS. 1 and 5A, the device isolation trenches 102T defining a plurality of active regions 103 may be formed in the substrate 101.

The substrate 101 may be a material suitable for semiconductor processing. The substrate 101 may include a semiconductor substrate. The substrate 101 may be made of a material containing silicon. The substrate 101 may include silicon, monocrystalline silicon, polysilicon, amorphous silicon, silicon germanium, monocrystalline silicon germanium, polycrystalline silicon germanium, carbon doped silicon, combinations thereof, or multiple layers thereof. The substrate 101 may include other semiconductor materials such as germanium. The substrate 101 may include a III/V group semiconductor substrate, for example, a compound semiconductor substrate such as GaAs. The substrate 101 may include a silicon on insulator (SOI) substrate.

The active region 103 defined by the device isolation trench 102T may be formed to have a major axis and a minor axis, and may be two-dimensionally arranged along the major axis direction and the minor axis direction. For example, the active region 103 may have a bar shape having a length longer than a width, and may be arranged is in an island shape.

The device isolation trench 102T may include a first region R1 and a second region R2. The active regions 103 may be spaced apart by the first region R1 having a first interval along the first direction. The active regions 103 may be spaced apart by the second region R2 having a second interval.

Figure 5B:
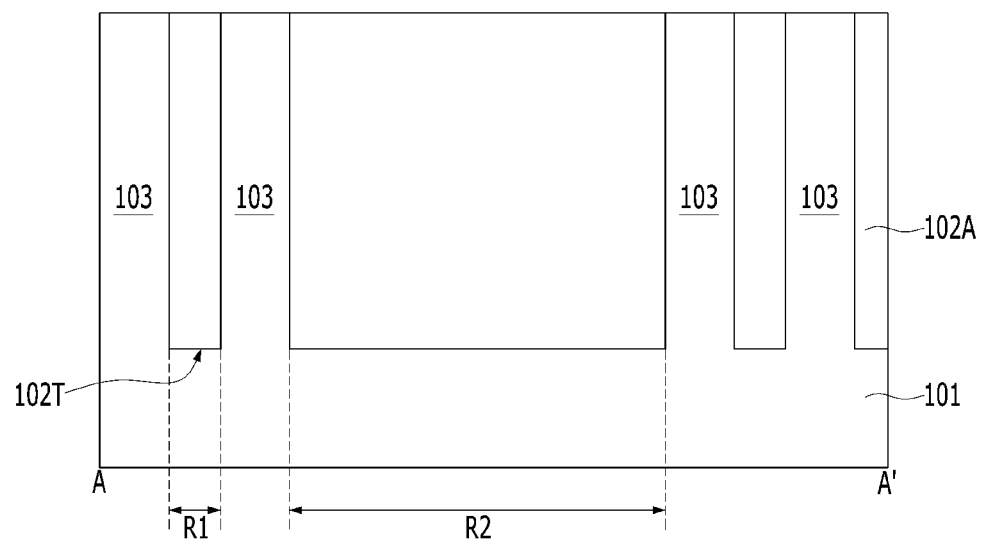

As shown in FIGS. 1 and 5B, the device isolation layer 102A gap-filling the device isolation trench 102T may be formed. For example, the insulating material may include silicon oxide. The device isolation layer 102A may be formed through a series of processes of gap-filling an insulating material in the device isolation trench 102T and etching the insulating material with the top surface of the substrate 101 as a target. The device isolation layer 102A may be formed by a shallow trench isolation (STI) process.

Figure 5C:
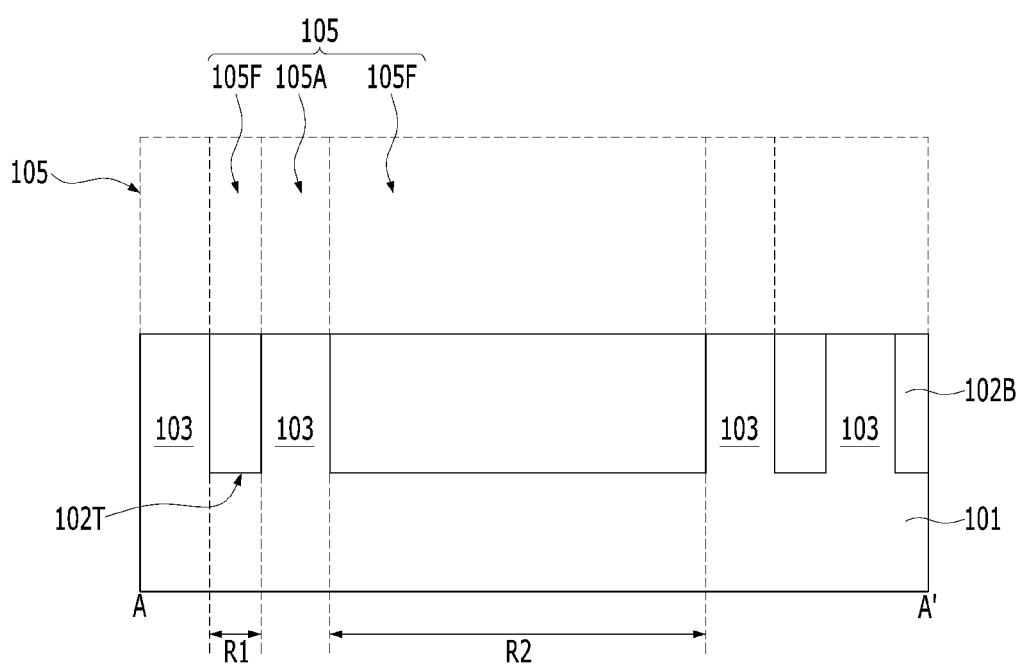

As shown in FIGS. 1 and 5C, the gate trench 105 extending along the short axis direction of the active region 103 may be formed. The bottom surface of the gate trench 105 may be located at a higher level than the bottom surface of the device isolation trench 102T.

The gate trench 105 may include an active trench 105A crossing the active region 103 and a field trench 105F formed in the device isolation layer 102B. The gate trench 105 may continuously extend from the active trench 105A to the field trench 105F. The device isolation layer 102B excluding the field trench 105F may have the top surface at the same level as the top surface of the substrate 101. The device isolation layer 102B excluding the field trench 105F may be referred to as an 'isolation insulating layer 102R' (refer to FIG. 2B).

Figure 5D:
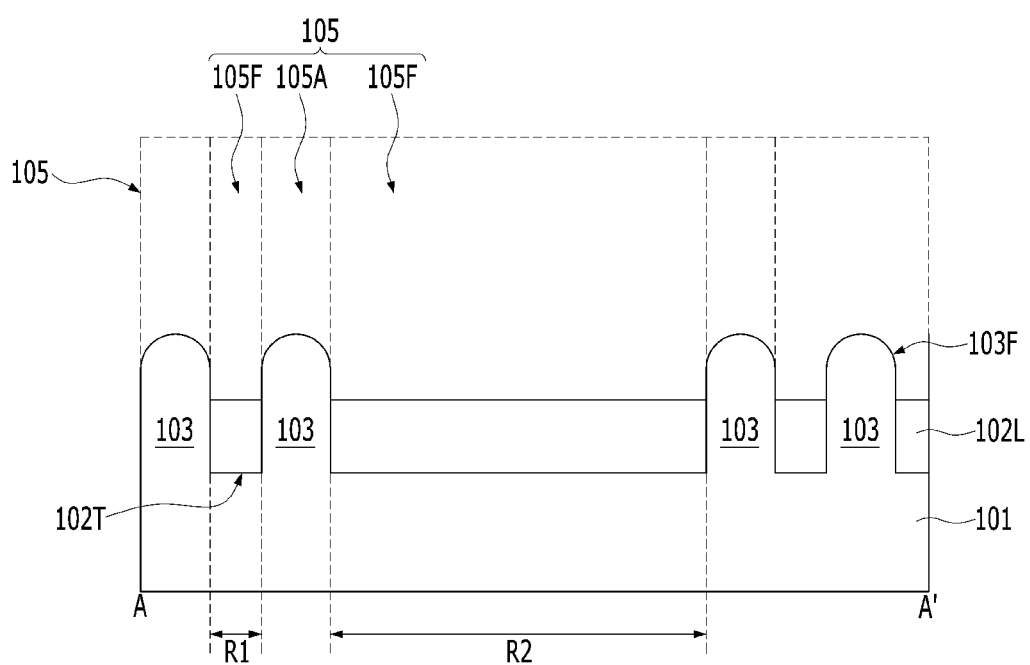

As shown in FIGS. 1 and 5D, the device isolation layer 102B (refer to FIG. 5C) buried in the field trench 105F may be further recessed. Accordingly, the bottom surface of the field trench 105F may be located at a lower level than the bottom surface of the active trench 105A.

The device isolation layer 102B gap-filled in the device isolation trench 102T overlapping the field trench 105F may be referred to as a 'first insulating layer 102L.'

The top surface of the first insulating layer 102L may be located at a level lower than the top surface of the active trench 105A. A protruding region of the active region 103 above the first insulating layer 102L may be referred to as a 'fin 103F.'

Figure 5E:
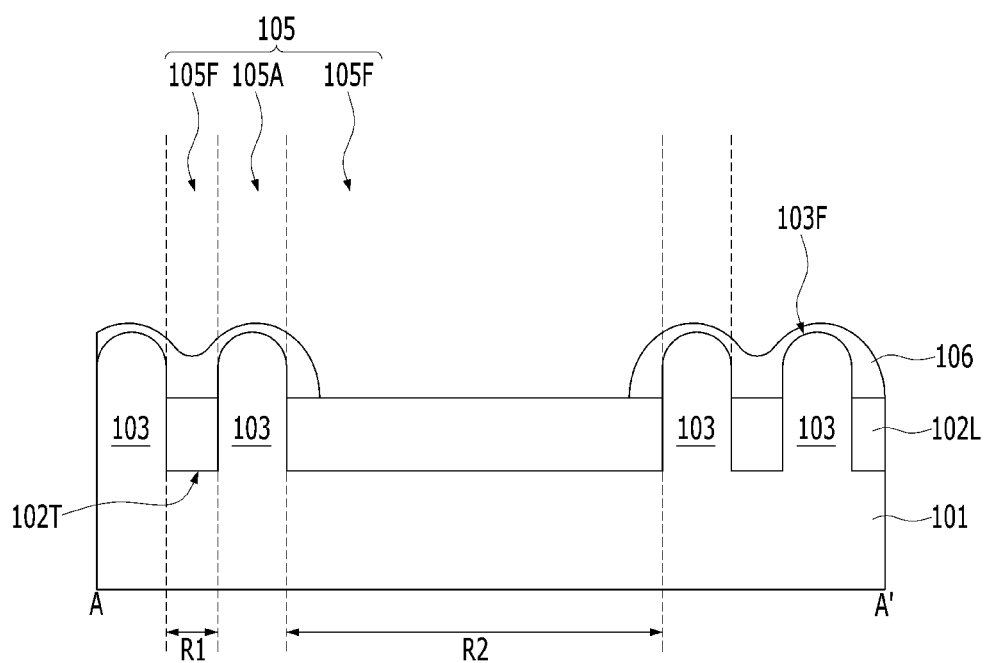

As shown in FIGS. 1 and 5E, a sacrificial spacer 106 may be formed on both sidewalls of the fin 103F. The sacrificial spacer 106 may include an insulating material having an etch selectivity with respect to the device isolation layer 102. For example, the sacrificial spacer 106 may include silicon nitride.

The sacrificial spacer 106 may be formed through, for example, a topology selective atomic layer deposition (TS-ALD) process. TS-ALD may include plasma ALD, and in particular, refers to a process of selectively depositing only on a horizontal surface or a vertical sidewall according to a plasma parameter.

The field trench 105F disposed between the active regions 103 adjacent in the first direction D1, that is, the first region R1 of the substrate isolation trench 102T may be all gap-filled by the sacrificial spacer 106. The sacrificial spacer 106 may be formed thickly on the sidewall of the fin 103F to gap-fill all the first regions R1 of the device isolation trench 102T, and the sacrificial spacer 106 may be formed thinly on the top surface of the fin 103F. The sacrificial spacer 106 formed on the sidewall of the fin 103F to gap-fill all the first regions R1 of the device isolation trench 102T may have a first thickness. The sacrificial spacer 106 formed on the top surface of the fin 103F may have a second thickness which is smaller than the first thickness. That is, both the top surface and the sidewall of the fin 103F may be covered by the sacrificial spacers 106 having different thicknesses. In the second region R2 of the device isolation trench 102T, since the sacrificial spacer 106 is formed only on the sidewall of the adjacent active region 103, all other regions are exposed.

Figure 5F:
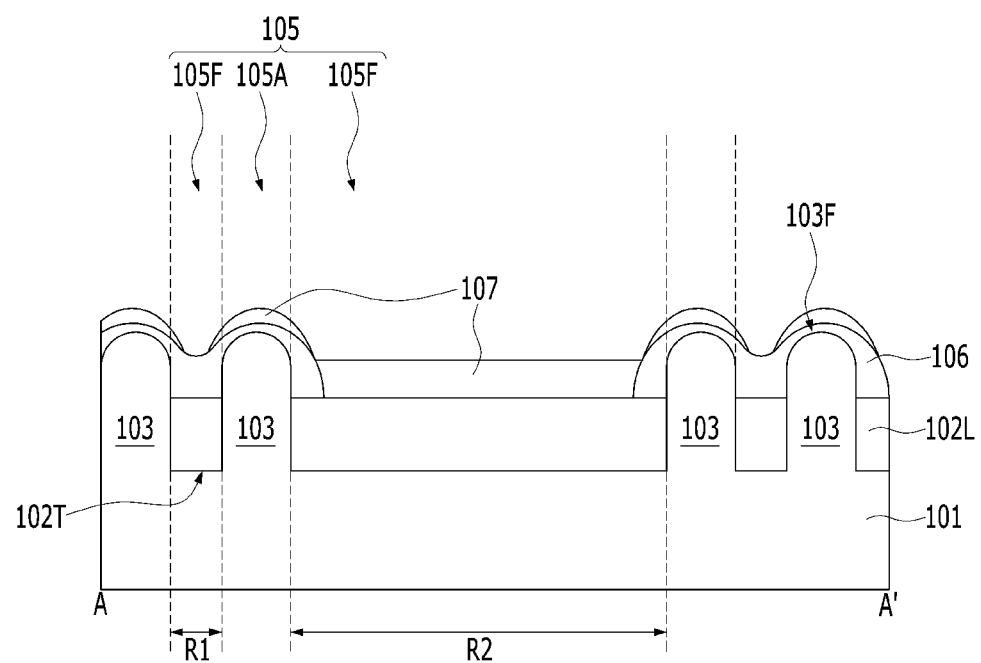

As shown in FIGS. 1 and 5F, the insulating material layer 107 may be formed. The insulating material layer 107 may cover at least a part of the sacrificial layer 106.

The insulating material layer 107 may include an insulating material having an etch selectivity with respect to the sacrificial spacer 106. The insulating material layer 107 may include the same oxide material as the first insulating layer 102L. For example, the insulating material layer 107 may include silicon oxide. In another embodiment, the insulating material layer 107 may include a different oxide material from the first insulating layer 102L.

The insulating material layer 107 may be formed to have a low step coverage characteristic. The insulating material layer 107 may be thickly formed on a horizontal plane parallel to the surface of the substrate 101 and thinly formed in a direction perpendicular to the surface of the substrate 101. For example, the insulating material layer 107 may be thickly formed on the first insulating layer 102L formed in the second region R2 of the device isolation trench 102T and the sacrificial spacer 106 formed on the top surface of the fin 103F. The insulating material layer 107 may be thinly formed on the sacrificial spacer 106 formed on the sidewall of the fin 103F.

Figure 5G:
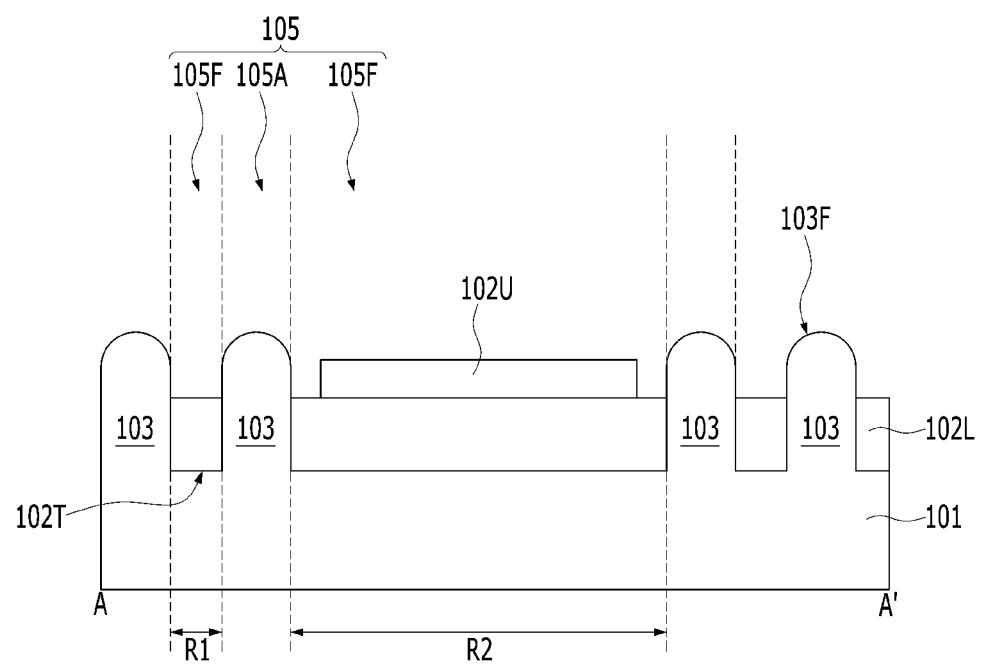

As shown in FIGS. 1 and 5G, the sacrificial spacer 106 (refer to FIG. 5F) may be removed. The process of removing the sacrificial spacer 106 may be performed under conditions of having an etch selectivity with respect to the first insulating layer 102L and the insulating material layer 107.

The insulating material layer 107 formed on the sacrificial spacer 106 and the fin 103F may be removed together when the sacrificial spacer 106 is removed. For example, since the top surface and the sidewall of the fin 103F are all covered by the sacrificial spacer 106, the insulating material layer 107 formed on the fin 103F may be removed when the sacrificial spacer 106 formed between the top surface of the fin 103F and the insulating material layer 107 is removed. As a result, both the top surface and both sidewalls of the fin 103F may be exposed.

The stack structure of the first insulating layer 102L and the second insulating layer 102U may remain in the second region R2 of the device isolation trench 102T, and the first insulating layer 102L may remain in the first region R1 of the device isolation trench 102T.

Figure 5H:
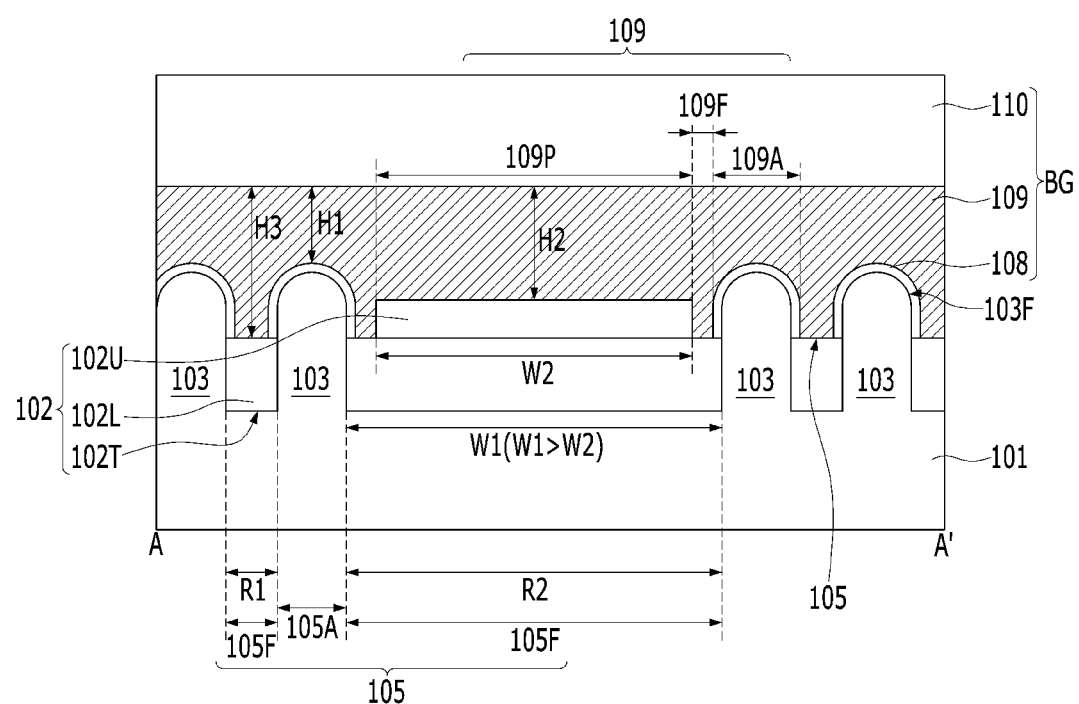

As shown in FIGS. 1 and 5H, a buried gate structure BG may be formed to gap-fill the gate trench 105.

The buried gate structure BG may include a gate insulating layer 108 covering the surface of the gate trench 105 including the fin 103F, a gate electrode 109 gap-filling a portion of the gate trench 105 over the gate insulating layer 108, and a gate capping layer 110 gap-filling the remainder of the gate trench 105 over the gate electrode 109. For example, the gate insulating layer 108 may be formed through an oxidation process. In another embodiment, the gate insulating layer 108 may be formed over the active trench 105A and the field trench 105F of the gate trench 105 depending on a fabricating process.

The buried gate structure BG may be referred to as a 'word line WL.' Since the word line is formed of buried gate lines, a buried channel transistor may be implemented. The buried channel transistor may reduce a unit cell area and increase an effective channel length compared to a planar transistor. In the buried channel transistor, since the word line is buried in the substrate, the capacitance between the word line and the bit line and the total capacitance of the bit line can be lowered to reduce parasitic capacitance.

As described above, in the present embodiment, by additionally forming the second insulating layer 102U on the second region R2 of the device isolation trench 102T overlapping the field trench 105F, the depth of the field gate electrode 109P, that is, the passing gate which crosses the device isolation layer 102 formed between the second impurity regions 112 of the active regions 103 adjacent to each other with one word line 109 interposed therebetween, may be as shallow as a thickness of the second insulating layer 102U. Accordingly, the area of the field gate electrode 109P of a word line facing the active gate electrode 109A of an adjacent word line is reduced, thereby preventing word line interference between neighboring cells (Row Hammer).

For example, when the first word line WL1 of FIG. 1 is turned off and the second word line WL2 is turned on, the area of the field gate electrode of the second word line facing the active gate electrode of the first word line WL1 is reduced. Then, the parasitic capacitance between the active gate electrode of the first word line WL1 and the field gate electrode of the second word line WL2 is reduced. Accordingly, it is possible to prevent the word line interference phenomenon in which the voltage applied to the field gate electrode of the second word line WL2 increases the potential of the channel region under the active gate electrode of the turned-off first word line WL1.

FIGS. 6A to 6D are cross-sectional views illustrating a method of fabricating the semiconductor device illustrated in FIG. 3. FIGS. 6A to 6D refer to the process after FIG. 5E. Among the reference numerals shown in FIGS. 6A to 6D, the same reference numerals as those shown in FIGS. 5A to 5H indicate the same components.

Figure 6A:
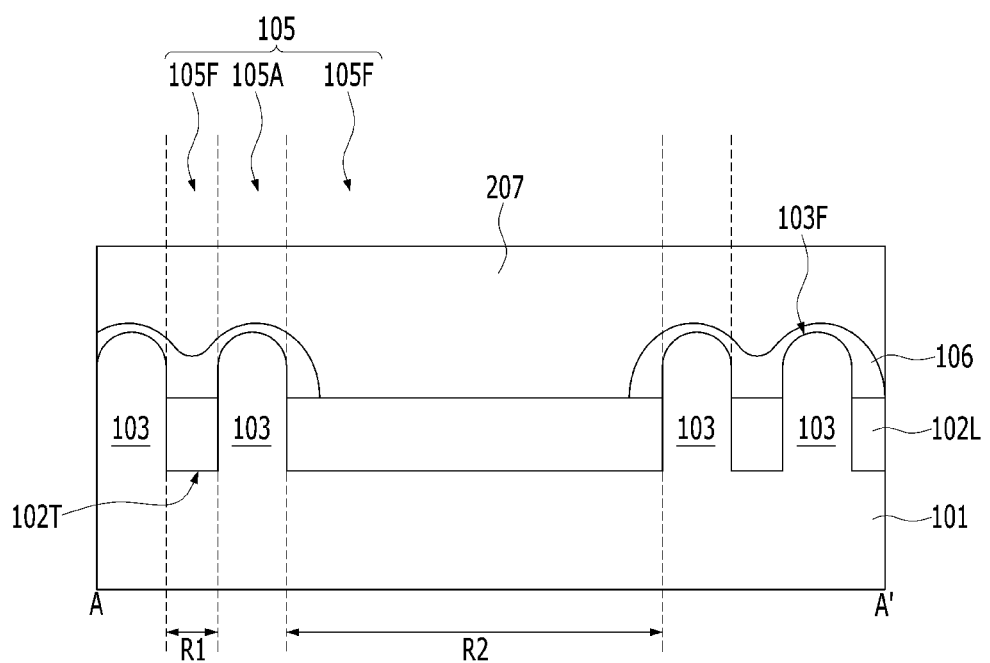
FIGS. 6A to 6D are cross-sectional views illustrating a method of fabricating the semiconductor device illustrated in FIG. 3.

As shown in FIGS. 1 and 6A, an insulating material layer 207 may be formed on the entire surface including the sacrificial spacer 106 formed by the process illustrated in FIG. 5E. The insulating material layer 207 may be formed to have a thickness such that the top surface of the insulating material layer 207 is located at a higher level than the top surface of the fin 103F.

The insulating material layer 207 may include an insulating material having an etch selectivity with respect to the sacrificial spacer 106. The insulating material layer 207 may include the same oxide material as the first insulating layer 102L. For example, the insulating material layer 207 may include silicon oxide. In another embodiment, the insulating material layer 207 may include a different oxide material from the first insulating layer 102L.

The insulating material layer 207 may be formed by, for example, a chemical vapor deposition process or an atomic layer deposition process.

Figure 6B:
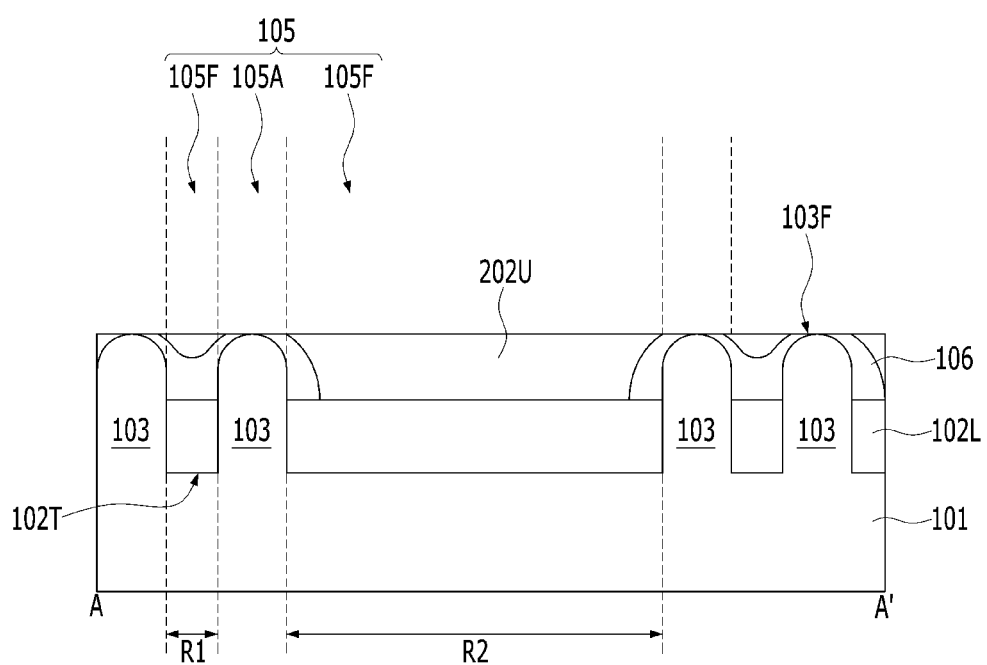
Figure 6C:
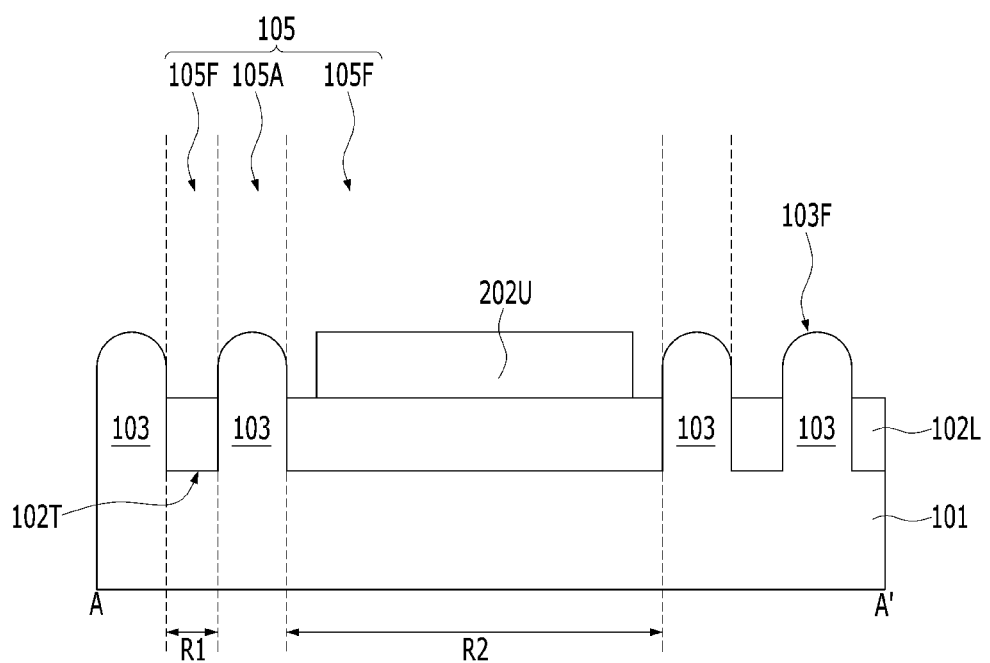

As shown in FIGS. 1, 6B and 6C, the insulating material layer 207 may be etched with a target such that the top surface of the fin 103F is exposed. The insulating material layer 207 may be etched through a planarization process. The planarization process may include an etch-back process or a chemical mechanical polishing (CMP) process. In another embodiment, the insulating material layer 207 may be subjected to a planarization process with a target such that the sacrificial spacer 106 formed on the top surface of the fin 103F is exposed.

The sacrificial spacer 106 may then be removed. The process of removing the sacrificial spacer 106 may be performed under conditions of having an etch selectivity with respect to the first insulating layer 102L and the insulating material layer 207. The insulating material layer 207 remaining between the sacrificial spacers 106 in the first region R1 of the device isolation trench 102T may be removed together when the sacrificial spacers 106 are removed. Also, the upper edge of the insulating material layer 207 formed between the sacrificial spacers 106 in the second region R2 of the device isolation trench 102T may be partially lost when the sacrificial spacer 106 is removed or during a cleaning process.

Accordingly, the second region R2 of the device isolation trench 102T may be formed to have a stack structure of the first insulating layer 102L and the second insulating layer 202U having a top surface at the same level as the top surface of the fin 103F. The first insulating layer 102L may remain in the first region R1 of the device isolation trench 102T.

Figure 6D:
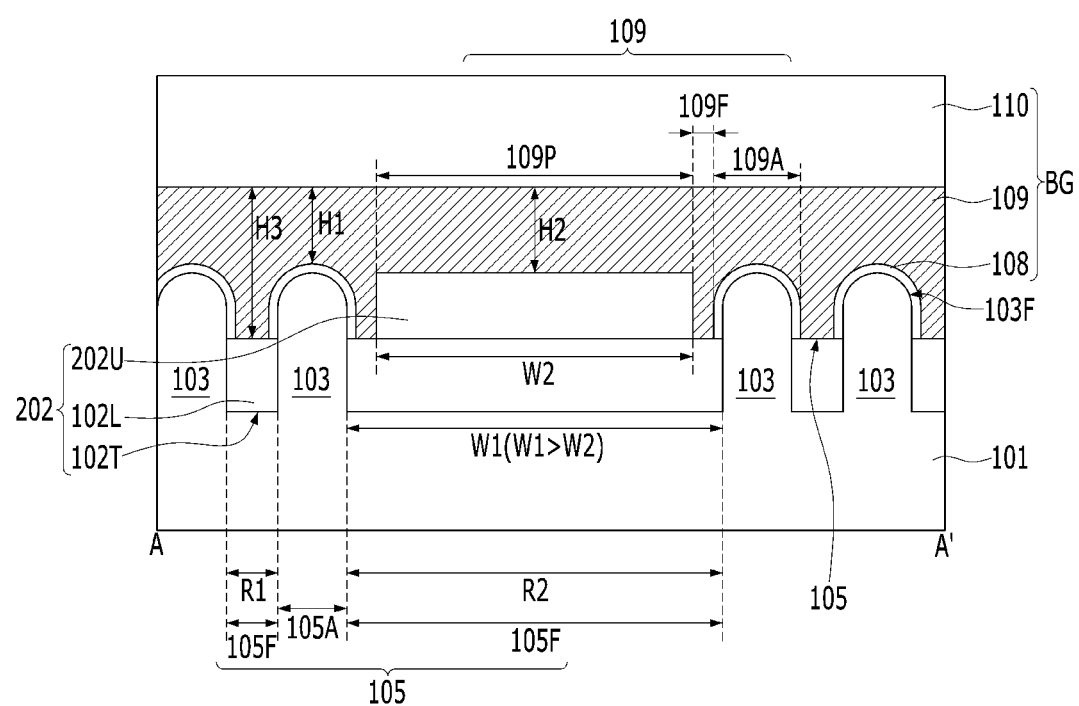

As shown in FIGS. 1 and 6D, a buried gate structure BG may be formed to gap-fill the gate trench 105.

The buried gate structure BG may include a gate insulating layer 108 covering the surface of the gate trench 105 including the fin 103F, a gate electrode 109 gap-filling a portion of the gate trench 105 over the gate insulating layer 108, and a gate capping layer 110 gap-filling the remainder of the gate trench 105 over the gate electrode 109. In another embodiment, the gate insulating layer 108 may be formed over the active trench 105A and the field trench 105F of the gate trench 105 depending on a fabricating process.

In the device isolation layer 202 under the buried gate structure BG, the stack structure of the first insulating layer 102L and the second insulating layer 202U remains in the second region R2, and the first insulating layer 102L remains in the first region R1.

FIGS. 7A to 7E are cross-sectional views illustrating a method of fabricating the semiconductor device illustrated in FIG. 4. FIGS. 7A to 7E refer to the process to be performed after the process shown in FIG. 5E. Among the reference numerals illustrated in FIGS. 7A to 7E, the same reference numerals as those illustrated in FIGS. 5A to 5H indicate the same components.

Figure 7A:
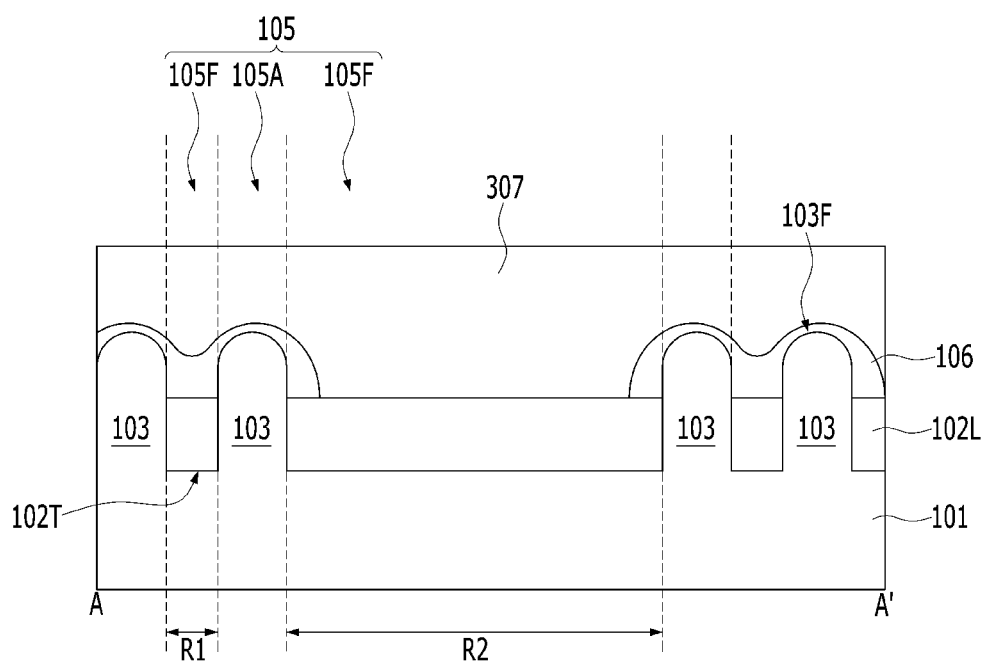
FIGS. 7A to 7E are cross-sectional views illustrating a method of fabricating the semiconductor device illustrated in FIG. 4.

As shown in FIGS. 1 and 7A, an insulating material layer 307 may be formed on the entire surface including the sacrificial spacer 106 formed by the process shown in FIG. 5E. The insulating material layer 307 may be formed to have a thickness such that the top surface of the insulating material layer 307 is positioned at a higher level than the top surface of the fin 103F.

The insulating material layer 307 may include an insulating material having an etch selectivity with respect to the sacrificial spacer 106. The insulating material layer 307 may include the same oxide material as the first insulating layer 102L. For example, the insulating material layer 307 may include silicon oxide. In another embodiment, the insulating material layer 307 may include a different oxide material from the first insulating layer 102L.

The insulating material layer 307 may be formed by, for example, a chemical vapor deposition process or an atomic layer deposition process.

Figure 7B:
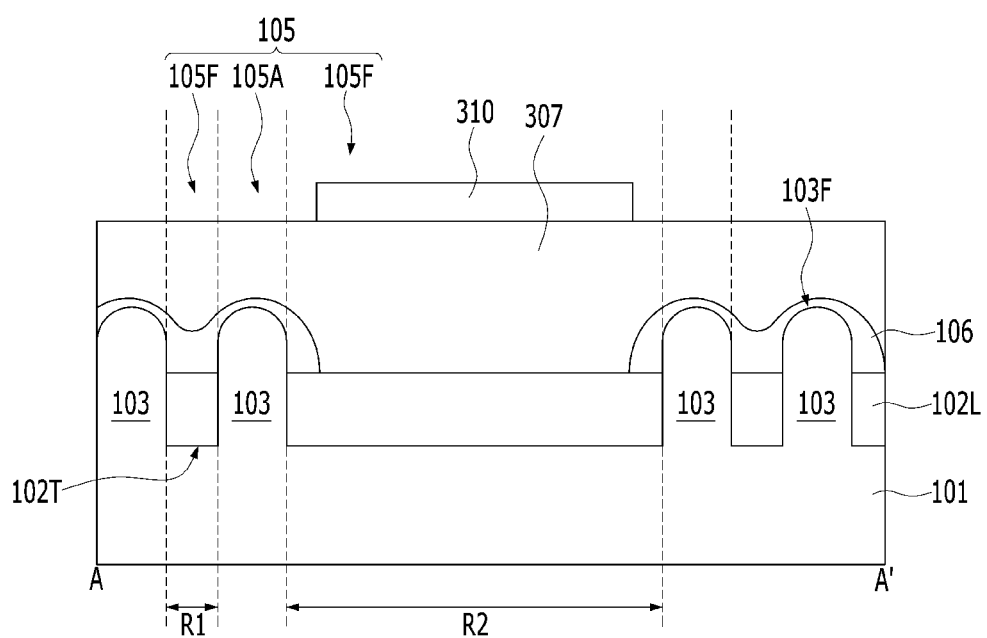
Figure 7C:
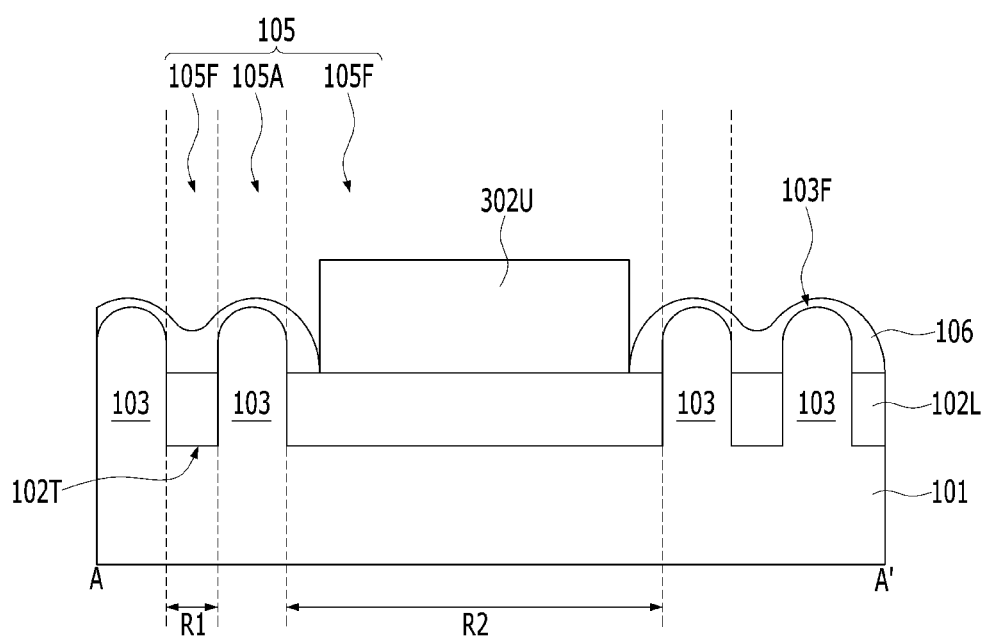

As shown in FIGS. 1, 7B, and 7C, a mask pattern 310 may be formed on the insulating material layer 307 of the second region R2 of the device isolation trench 102T. The mask pattern 310 may be patterned smaller than the passing gate region. The mask pattern 310 may be formed to have an island shape. A width of the mask pattern 310 in the first direction D1 may be smaller than a line width of the second region R2. A width of the mask pattern 310 in the second direction D2 may be the same as the line width of the gate trench 105.

Next, the insulating material layer 307 may be etched by using the mask pattern 310. The etching of the insulating material layer 307 may be performed under a condition having an etching selectivity with respect to the substrate 101 and the sacrificial spacer 106. Accordingly, the second insulating layer 302U having a top surface at a higher level than the top surface of the fin 103F may be formed.

Subsequently, the mask pattern 310 may be removed.

Figure 7D:
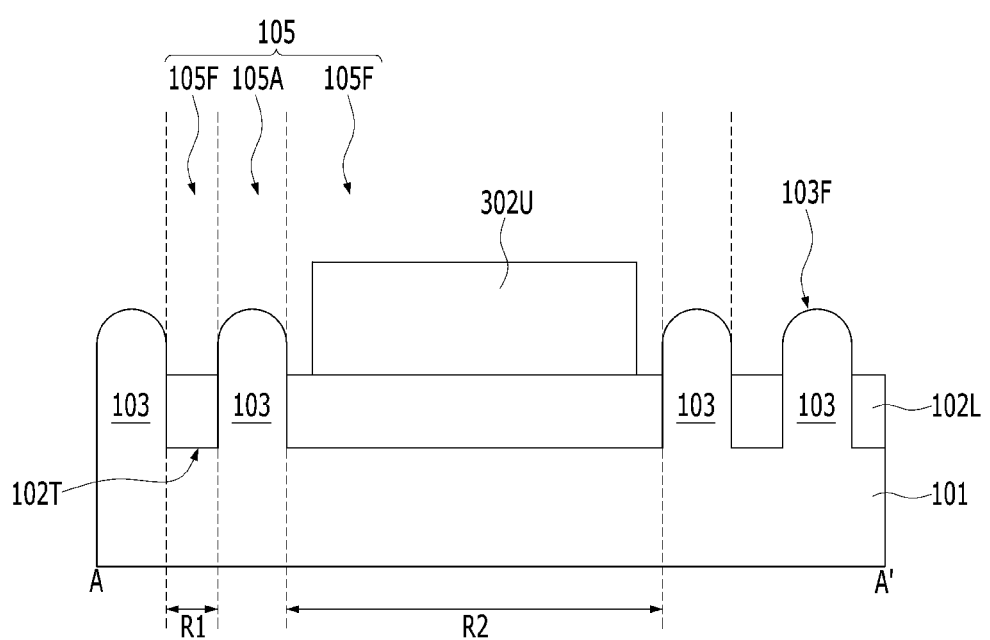

As shown in FIGS. 1 and 7D, the sacrificial spacer 106 (refer to FIG. 7C) may be removed. The process of removing the sacrificial spacer 106 may be performed under a condition of having an etch selectivity with respect to the first insulating layer 102L and the second insulating layer 302U.

Accordingly, the stack structure of the first insulating layer 102L and the second insulating layer 302U may remain in the second region R2 of the device isolation trench 102T, and the first insulating layer 102L may remain in the first region R1 of the device isolation trench 102T.

Figure 7E:
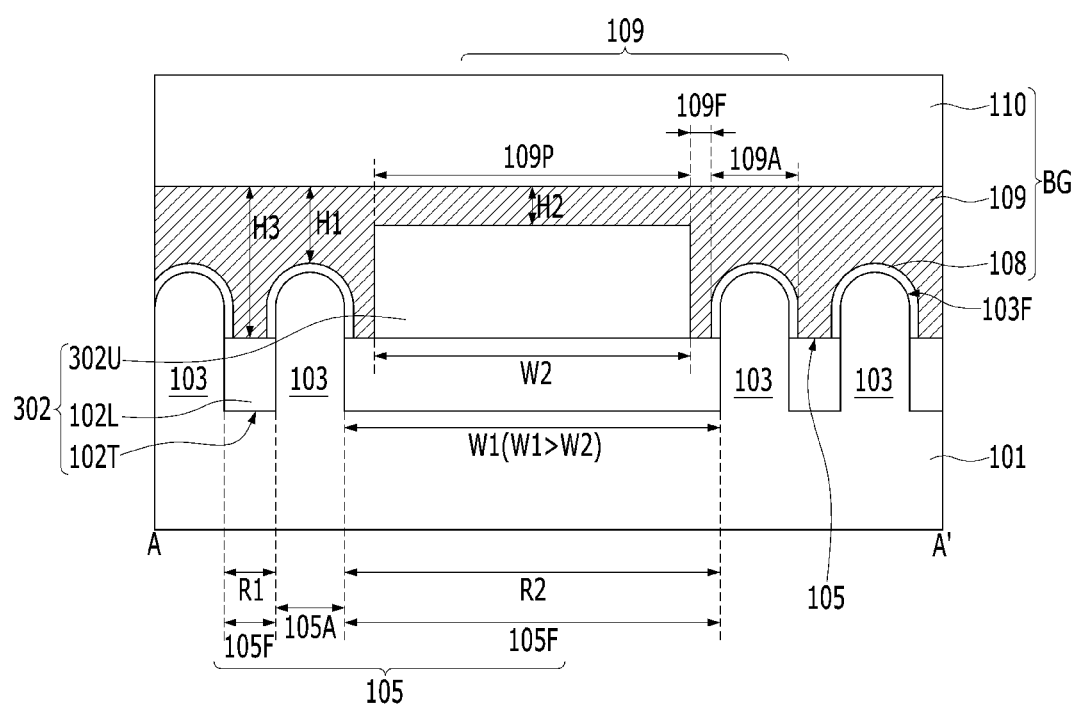

As shown in FIGS. 1 and 7E, a buried gate structure BG may be formed to gap-fill the gate trench 105.

The buried gate structure BG may include a gate insulating layer 108 covering the surface of the gate trench 105 including the fin 103F, a gate electrode 109 gap-filling a portion of the gate trench 105 over the gate insulating layer 108, and a gate capping layer 110 gap-filling the remainder of the gate trench 105 over the gate electrode 109. In another embodiment, the gate insulating layer 108 may be formed over the active trench 105A and the field trench 105F of the gate trench 105 depending on a fabricating process.

In the device isolation layer 302 under the buried gate structure BG, the stack structure of the first insulating layer 102L and the second insulating layer 302U remains in the second region R2, and the first insulating layer 102L remains in the first region R1.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor device comprising:
    a device isolation layer defining a plurality of active regions on a substrate and including a first region and a second region, the active regions being spaced apart in a first direction by the first region having a first interval and by the second region having a second interval, the second interval being larger than the first interval;
    a gate trench extending in the first direction to cross the active regions and the first and second regions of the device isolation layer; and
    a buried word line gap-filling the gate trench,
    wherein the first region of the device isolation layer disposed below the gate trench is formed by a first insulating layer, and
    wherein the second region of the device isolation layer disposed below the gate trench is formed by a stack structure of the first insulating layer and a second insulating layer,
    wherein the first and second insulating layers are in direct contact, and the first and second insulating layers include a same material,
    wherein a top surface of the second insulating layer formed in the second region of the device isolation layer is located at a higher level than a top surface of the first insulating layer formed in the first region of the device isolation layer.

2. The semiconductor device of claim 1, wherein a top surface of the first insulating layer is located at a lower level than a bottom surface of the gate trench.

3. The semiconductor device of claim 1, wherein a top surface of the second insulating layer is located at a lower level than a bottom surface of the gate trench.

4. The semiconductor device of claim 1, wherein a top surface of the second insulating layer is located at the same level as a bottom surface of the gate trench.

5. The semiconductor device of claim 1, wherein a top surface of the second insulating layer is located at a higher level than a bottom surface of the gate trench.

6. The semiconductor device of claim 1, wherein a width of the second insulating layer is smaller than a width of the second region of the device isolation layer.

7. The semiconductor device of claim 1, wherein the buried word line includes an active gate electrode disposed in the active region and a passing gate electrode disposed in the device isolation layer.

8. The semiconductor device of claim 7,
    wherein the buried word line further includes fin gate electrodes formed over the device isolation layer, and
    wherein the fin gate electrode is connected to the active gate electrodes and the passing gate electrodes.

9. The semiconductor device of claim 8, wherein a bottom surface of the fin gate electrodes is located at a lower level than a bottom surface of the passing gate electrode.

10. The semiconductor device of claim 8, wherein a bottom surface of the fin gate electrodes is located at a lower level than a bottom surface of the active gate electrode.

11. The semiconductor device of claim 1, wherein the first and second insulating layers include a silicon oxide material.

12. A method of fabricating a semiconductor device, the method comprising:
    forming a device isolation layer defining a plurality of active regions on a substrate and including a first region and a second region, the active regions being spaced apart in a first direction by the first region having a first interval and by the second region having a second interval, the second interval being larger than the first interval;
    forming a gate trench extending in the first direction to cross the active regions and the first and second regions of the device isolation layer; and
    forming a buried word line gap-filling the gate trench,
    wherein the first region of the device isolation layer disposed below the gate trench is formed by a first insulating layer, and
    wherein the second region of the device isolation layer disposed below the gate trench is formed by a stack structure of the first insulating layer and a second insulating layer,
    wherein the first and second insulating layers are in direct contact, and the first and second insulating layers include a same material,
    wherein a top surface of the second insulating layer formed in the second region of the device isolation layer is located at a higher level than a top surface of the first insulating layer formed in the first region of the device isolation layer.

13. The method of claim 12, after the forming of the gate trench, further including:
    forming the first insulating layer by recessing the device isolation layer, the first insulating layer providing a fin; and
    forming the second insulating layer over the device isolation layer disposed below the gate trench.

14. The method of claim 13, wherein the forming of the second insulating layer includes:
    exposing the first insulating layer disposed below the gate trench by selectively forming a sacrificial spacer on both sidewalls of the fin;
    forming an insulating material over the exposed first insulating layer; and
    selectively removing the sacrificial spacer.

15. The method of claim 14, wherein the sacrificial spacer includes a material having an etch selectivity with respect to the first insulating layer and the insulating material.

16. The method of claim 14, wherein the sacrificial spacer is selectively formed on a sidewall of the fin by a TS-ALD (Topology Selective ALD) process.

17. The method of claim 13, wherein the forming of the second insulating layer includes:
    exposing the first insulating layer disposed below the gate trench by selectively forming sacrificial spacers on both sidewalls of the fin;
    forming an insulating material over an entire surface, the entire surface including the exposed first insulating layer;

etching the insulating material with a target of exposing a top surface of the fin; and removing the sacrificial spacer.

18. The method of claim 17, wherein the sacrificial spacer includes a material having an etch selectivity with respect to the first insulating layer and the insulating material.

19. The method of claim 17, wherein the sacrificial spacer is selectively formed on a sidewall of the fin by a TS-ALD (Topology Selective ALD) process.

20. The method of claim 13, wherein the forming of the second insulating layer includes:

exposing the first insulating layer disposed below the gate trench by selectively forming a sacrificial spacer on both sidewalls of the fin;

forming an insulating material over an entire surface including the exposed first insulating layer;

forming a mask pattern over the insulating material;

patterning the insulating material to remain on the exposed first insulating layer using the mask pattern; and removing the sacrificial spacer.

21. The method of claim 20, wherein the sacrificial spacer includes a material having an etch selectivity with respect to the first and second insulating layers.

22. The method of claim 20, wherein the sacrificial spacer is selectively formed on a sidewall of the fin by a TS-ALD (Topology Selective ALD) process.

23. The method of claim 12, wherein the first and second insulating layers include silicon oxide.

24. A semiconductor device comprising:

a plurality of active regions arranged along a first direction in a substrate and separated by alternating first and second regions of a device isolation layer; and a buried word line extending in the first direction and crossing the plurality of the active regions and the first and second regions of the device isolation layer, wherein the first region of the device isolation layer is formed by a first insulating layer and the second region of the device isolation layer is formed by a stack of the first insulating layer and a second insulating layer, wherein the first and second insulating layers are in direct contact, and the first and second insulating layers include a same material, wherein a top surface of the second insulating layer formed in the second region of the device isolation layer is located at a higher level than a top surface of the first insulating layer formed in the first region of the device isolation layer.

* * * * *